(12) United States Patent
Lin

(10) Patent No.: US 7,944,315 B2
(45) Date of Patent: May 17, 2011

(54) PROGRAMMABLE VOLTAGE-CONTROLLED OSCILLATOR

(75) Inventor: Wei-Cheng Lin, Jhonghe (TW)

(73) Assignee: Amazing Microelectronic Corp., Jhonghe, Taipei County (TW)

( * ) Notice: Subject to any disclaimer, the term of this patent is extended or adjusted under 35 U.S.C. 154(b) by 54 days.

(21) Appl. No.: 12/508,132

(22) Filed: Jul. 23, 2009

(65) Prior Publication Data

US 2010/0060364 A1    Mar. 11, 2010

(30) Foreign Application Priority Data

Sep. 10, 2008  (TW) ............................... 97216338 U

(51) Int. Cl.
*G01R 23/00* (2006.01)
*H03B 5/20* (2006.01)
*H03B 5/24* (2006.01)
*H03K 3/02* (2006.01)
*H03K 3/023* (2006.01)
*H03L 1/00* (2006.01)

(52) U.S. Cl. .......... 331/44; 331/111; 331/143; 331/179; 331/185

(58) Field of Classification Search ............... 331/34, 331/44, 111, 113 R, 113 FE, 113 M, 143–145, 331/175, 177 R, 179, 185, 186, 116 R, 116 FE, 116 M See application file for complete search history.

(56) References Cited

U.S. PATENT DOCUMENTS

2007/0063776 A1*  3/2007  Okuda ........................... 331/16

* cited by examiner

*Primary Examiner* — David Mis

(74) *Attorney, Agent, or Firm* — Patterson & Sheridan, LLP

(57) ABSTRACT

The invention discloses a programmable voltage-controlled oscillator. The programmable voltage-controlled oscillator has an output frequency. The programmable voltage-controlled oscillator includes a control unit, a current selector, a current mirror unit, an oscillator module, and a one-time-programming component. The one-time-programming component is used for providing a programmable code. The current selector is used for generating a selected current according to the programmable code. The current mirror unit is used for generating a first mirroring current and a second mirroring current according to the selected current. The oscillator module is used for oscillating according to the first mirroring current and the second mirroring current. After the programmable code is tuned to drive the output frequency to approach a predetermined frequency, the control unit will burn the tuned programmable code into one-time-programming component.

6 Claims, 3 Drawing Sheets

PROGRAMMABLE VOLTAGE-CONTROLLED OSCILLATOR

BACKGROUND OF THE INVENTION

1. Field of the Invention

The present invention generally relates to a programmable voltage-controlled oscillator, and more particularly, to a programmable voltage-controlled oscillator which is capable of adjusting the output frequency to approach a predetermined frequency in the process of manufacture.

2. Description of the Prior Art

Along with the popularization of mobile communication products, the wireless structure and the circuit technology are becoming particularly significant. Therefore, in recent years, the miniaturization of the Complementary Metal-Oxide-Semiconductor (CMOS) technology has promoted the radio frequency of MOS component characteristic largely. One example of the CMOS radio frequency improvement is to use low-cost CMOS technology to realize the design of the single crystal transceiver. Thus, it is known that CMOS radio frequency integrated circuit (IC) technology has already made great progress to commercial applications.

Until now, in the circuit design domain (regardless of analogy circuit or digital circuit), a lot of oscillators are usually used for achieving different kinds of signal processing or communication functions. Particularly, one of essential components of wireless communication transceiver is voltage-controlled oscillator (VCO). The voltage-controlled oscillator is one important component that is often used for generating oscillating signal. The principle of the voltage-controlled oscillator is that according to the different reference voltages inputted, the oscillation is carried on by different oscillated frequencies. This characteristic enables the modulation signal to be the inputted voltage-controlled oscillator for generating different modulation signals such as FM modulation, PM modulation and PWM modulation. Although the voltage-controlled oscillator has been developed for a long time, the design of voltage-controlled oscillators is unceasingly been renovating along with the increasing quality of oscillators demanded by modern electronic apparatuses.

However, although the design of the voltage-controlled oscillator is been renovated unceasingly, there are still many problems to overcome in voltage-controlled oscillator. One common question is that in the manufacturing process of voltage-controlled oscillators, due to the limit of material or the difficulty of the process control, the output frequency discrepancy or noise error are generated by the voltage-controlled oscillator. It is thus known that the voltage-controlled oscillator is generally unavoidable to be affected by voltage, temperature and process shift, and so on. Generally speaking, it is impossible that two capacitors experienced the similar manufacturing process have identical capacitance value. Moreover, it is unable for the voltage-controlled oscillator which uses many capacitors to carry on the oscillation with the accurate output frequency. Therefore, how to enable the oscillator which is already completely assembled to successfully control the effective manufacturing rate of the voltage-controlled oscillator is a big challenge.

In this regard, the main domain of the invention is to present a programmable voltage-controlled oscillator that can tune the output frequency to the predetermined frequency in the manufacturing process. Furthermore, with the circuit structure of said programmable voltage-controlled oscillator, the parameter of the programmable voltage-controlled oscillator is able to be adjusted by the control unit in the manufacturing process. In addition, after the control unit adjusts the output frequency to the predetermined frequency, the adjusted programmable code will be burned in the one-time-programming (OTP) component, namely, the fixed output frequency. By doing so, the precision of the output frequency of the programmable voltage-controlled oscillator can be promoted effectively, and its reliability is increased as well.

SUMMARY OF THE INVENTION

Accordingly, an aspect of the present invention is to provide a programmable voltage-controlled oscillator. The programmable voltage-controlled oscillator has an output frequency. The programmable voltage-controlled oscillator mainly comprises a control unit, a current selector, a current mirror unit, an oscillator module and a one-time-programming component. The control unit is used for providing a programmable code. The current selector is electrically connected to the control unit. The current selector is used for generating selected current according to the programmable code. The current mirror unit is electrically connected to the current selector. The current mirror unit is used for generating a first mirroring current and a second mirroring current according to a selected current. The oscillator module is electrically connected to the current mirror unit. The oscillator module is used for oscillating according to the first mirroring current and the second mirroring current. The one-time-programming is electrically connected to the control unit and the current selector. After tuning the programmable code to make the output frequency approach a predetermined frequency, the control unit burns the tuned programmable code into the one-time-programming component. Therefore, the programmable voltage-controlled oscillator is able to control the output frequency according to the tuned programmable code burned in the one-time-programming component.

Another aspect of the present invention is to provide a programmable voltage-controlled oscillator. The programmable voltage-controlled oscillator has an output frequency. The programmable voltage-controlled oscillator mainly includes a control unit, a constant voltage source, a gain selector, a voltage follower, an oscillator module and a one-time-programming component. The control unit is used for providing a programmable code. The constant voltage source is used for providing a second constant voltage. The gain selector is electrically connected to the control unit. The gain selector generates a selected gain value according to the programmable code. The voltage follower is electrically connected to the constant voltage source and the gain selector respectively. The voltage follower generates a selected reference voltage according to the second constant voltage and the selected gain value. The oscillator module is electrically connected to the voltage follower. The oscillator module oscillates according to the selected reference voltage. The one-time-programming component is electrically connected to the control unit and the gain selector respectively. After tuning the programmable code to make the output frequency approach a predetermined frequency, the control unit burns the tuned programmable code into the one-time-programming component. By doing so, the programmable voltage-controlled oscillator is able to control the output frequency according to the tuned programmable code burned in the one-time-programming component.

Therefore, according to the programmable voltage-controlled oscillator of the present invention, the output frequency can be tuned to approach the predetermined frequency in the process of manufacture. Moreover, with the circuit structure of said programmable voltage-controlled oscillator, the parameter of the programmable voltage-controlled oscillator is able to be adjusted by the control unit in the manufacturing process. In addition, after the control unit adjusts the output frequency to the predetermined frequency, the adjusted programmable code will be burned in the one-time-programming component, namely, the fixed output frequency. By doing so, the precision of the output frequency of the programmable voltage-controlled oscillator can be promoted effectively, and its reliability is increased as well.

The objective of the present invention will no doubt become obvious to those of ordinary skill in the art after reading the following detailed description of the preferred embodiment, which is illustrated in various figures and drawings.

BRIEF DESCRIPTION OF THE APPENDED DRAWINGS

DETAILED DESCRIPTION OF THE INVENTION

The present invention provides a programmable voltage-controlled oscillator. And particularly, the programmable voltage-controlled oscillator is able to adjust an output frequency to a predetermined frequency in the process of manufacture. Consequently, the precision of the output frequency of the programmable voltage-controlled oscillator can be promoted effectively, and its reliability is increased as well. The embodiment and the practical applications of the present invention will be described in the following paragraphs, so as to sufficiently explain the characteristics, spirits, and advantages of the invention.

Figure 1:
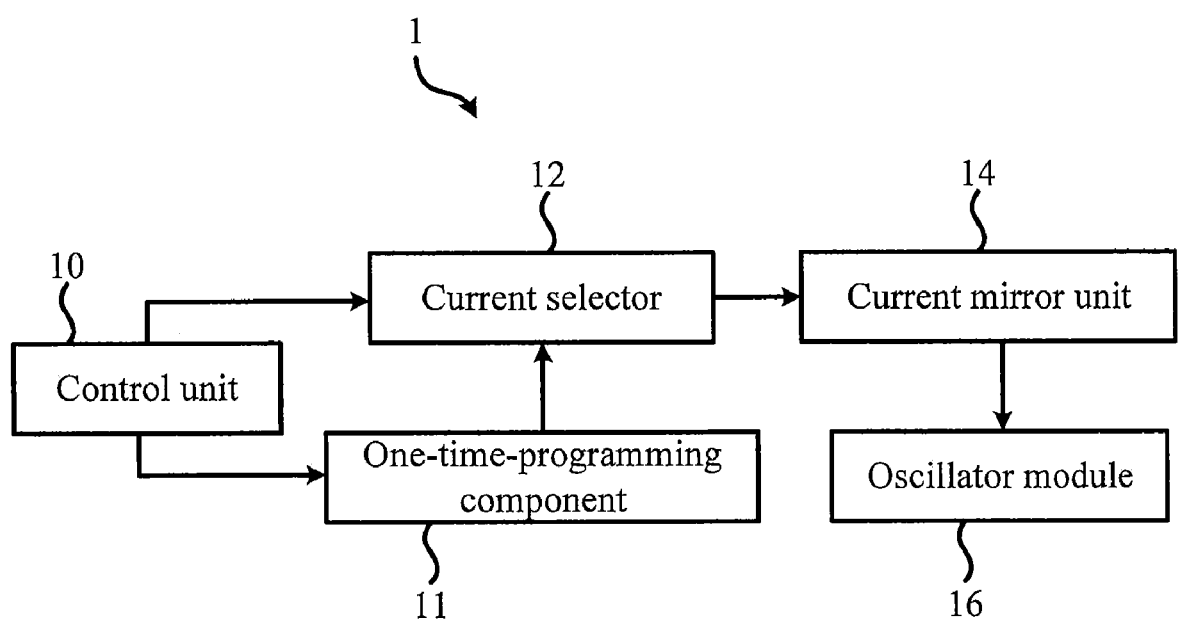
FIG. 1 is a function block diagram illustrating the programmable voltage-controlled oscillator of an embodiment of the invention.

Please refer to FIG. 1. FIG. 1 is a function block diagram illustrating the programmable voltage-controlled oscillator 1 of an embodiment of the invention. The programmable voltage-controlled oscillator 1 of the invention has an output frequency. As shown in FIG. 1, the programmable voltage-controlled oscillator 1 mainly includes a control unit 10, a one-time-programming component 11, a current selector 12, a current mirror unit 14 and an oscillator module 16. In the following, the programmable voltage-controlled oscillator 1 of an embodiment of the invention is thoroughly introduced and detailed explained.

As shown in FIG. 1, the control unit 10 is used for providing a programmable code. And the current selector 12 is electrically connected to the control unit 10. The current selector 12 is used for generating a selected current according to the programmable code provided by control unit 10. The current mirror unit 14 is electrically connected to the current selector 12. The current mirror unit 14 is used for generating a first mirroring current and a second mirroring current according to the selected current 12. The oscillator module 16 is electrically connected to the current mirror unit 14. The oscillator module 16 is used for oscillating according to the first mirroring current and the second mirroring current generated by the current mirror unit 14. The one-time-programming component 11 is electrically connected to the control unit 10 and the current selector 12 respectively. After adjusting the programmable code to enable the output frequency of the programmable voltage-controlled oscillator 1 to approach a predetermined frequency, the control unit 10 of the programmable voltage-controlled oscillator 1 makes the adjusted the programmable code burn in the one-time-programming component 11. By doing so, the programmable voltage-controlled oscillator 1 is able to adjust the output frequency of the programmable code according to the burned one-time-programming component 11. In an embodiment, the above mentioned the first mirroring current and the second mirroring current can be equal to the selected current generated by selector 12, but not limited to.

Please note that by changing the first mirroring current and the second mirroring current flowing through the oscillator module 16, the programmable voltage-controlled oscillator 1 of an embodiment is able to change the charging speed of the capacitor in the programmable voltage-controlled oscillator 1, and further achieves the change the output frequency of the programmable voltage-controlled oscillator 1.

Figure 2:
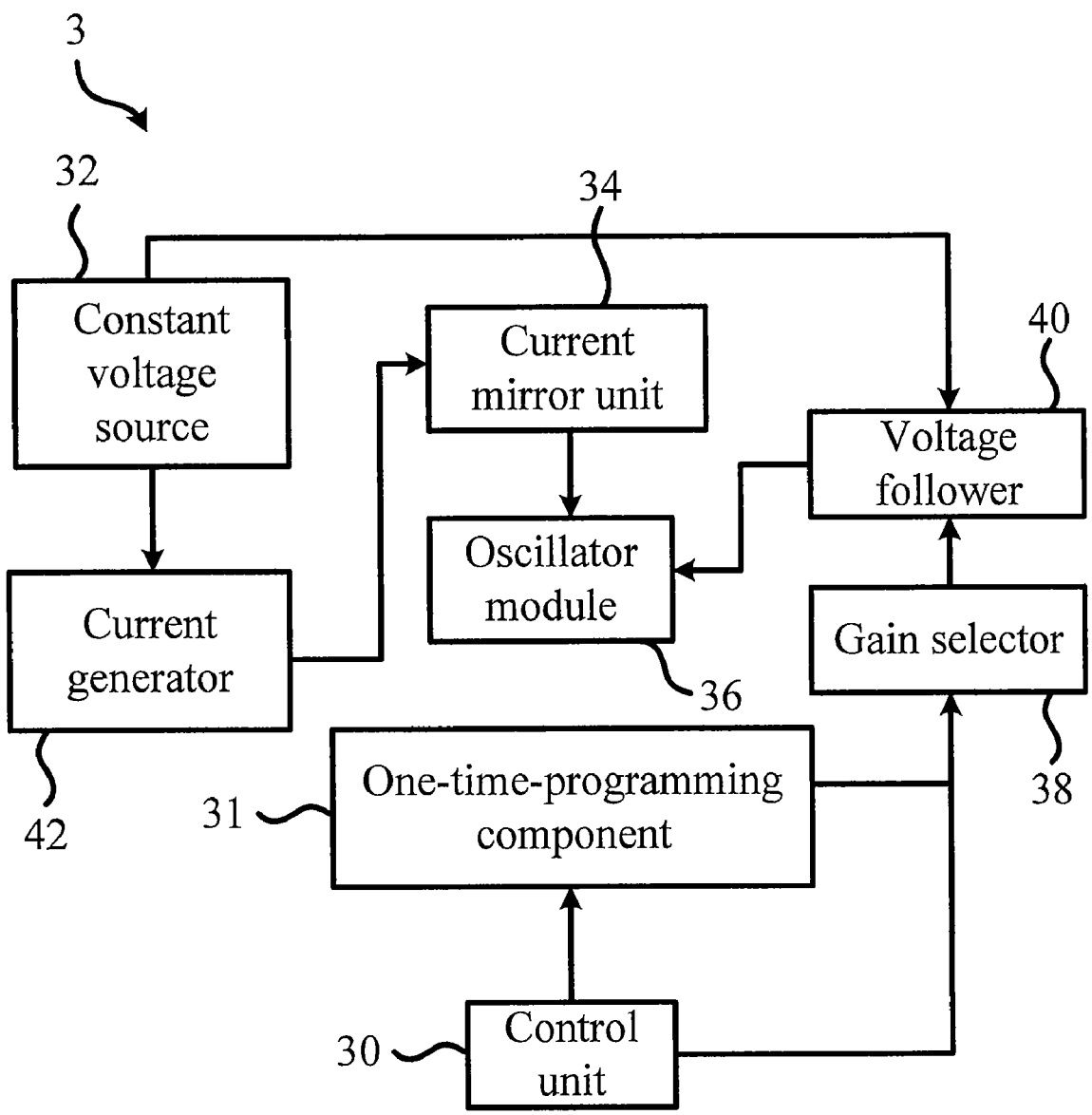
FIG. 2 is a function block diagram illustrating the programmable voltage-controlled oscillator of another embodiment of the invention.

Please refer to FIG. 2, which is a function block diagram illustrating the programmable voltage-controlled oscillator 3 of another embodiment of the invention. The programmable voltage-controlled oscillator 3 of the invention has an output frequency. As shown in FIG. 2, the programmable voltage-controlled oscillator 3 mainly includes a control unit 30, a one-time-programming component 31, a constant voltage source 32, a current mirror unit 34, a gain selector 38, a voltage follower 40, an oscillator module 36, and a current generator 42. In the following, the programmable voltage-controlled oscillator 3 of an embodiment of the invention is detailed explained.

As shown in FIG. 2, the control unit 30 is used for providing a programmable code. The constant voltage source 32 is used for providing a first constant voltage and a second constant voltage. The current generator 42 is electrically connected to the constant voltage source 32. The current generator 42 is used for generating a constant current according to a first constant voltage generated by the constant voltage source 32. The current mirror unit 34 is electronically connected to the current generator 42. The current mirror unit 34 is used for generating a first mirroring current and a second mirroring current according to the constant current generated by the current generator 42. The gain selector 38 is electrically connected to the control unit 30. The gain selector 38 is used for providing a gain value according to the programmable code provided by the control unit 30. The voltage follower 40 is electrically connected to the constant voltage source 32 and the gain selector 38 respectively. The voltage follower 40 is used for generating a selected reference voltage according to a second constant voltage provided by the constant voltage source 32 and the selected gain value generated by the gain selector 38. The oscillator module 36 is connected to the voltage follower 40 and the current mirror unit 34 respectively. The oscillator module 36 is used for oscillating according to the first mirroring current and the second mirroring current generated by the current mirror unit 34 and the selected reference voltage generated by the voltage follower 40. The one-time-programming component 31 is electrically connected to the control unit 30 and the gain selector 38 respectively. After adjusting the programmable code to make the output frequency of the programmable voltage-controlled oscillator 3 approach a predetermined frequency, the control unit 30 of the programmable voltage-controlled oscillator 3 is able to burn the adjusted programmable code in the one-time-programming component 31. By doing so, the programmable voltage-controlled oscillator 3 is able to adjust the output frequency of the programmable code according to the burned one-time-programming component 31.

Please note that by taking the comparator of the oscillator module 36 as the selected reference voltage of the reference voltage, the programmable voltage-controlled oscillator 3 of an embodiment is able to change the charging speed of the capacitor in the programmable voltage-controlled oscillator 3, and further achieves the change the output frequency of the programmable voltage-controlled oscillator 3.

Figure 3:
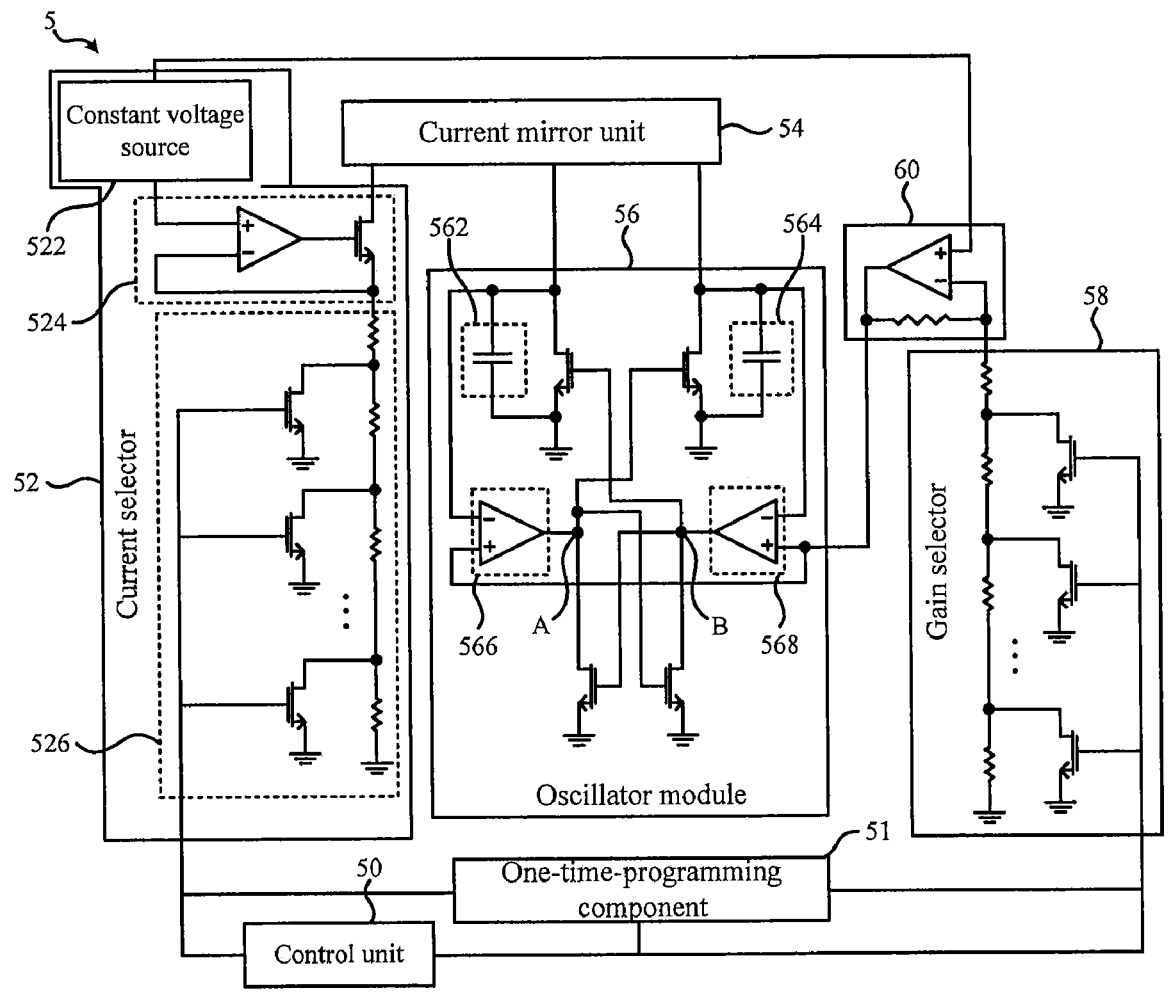
FIG. 3 is a circuit diagram of the programmable voltage-controlled oscillator of an embodiment of the invention.

Please refer to FIG. 3. FIG. 3 is a circuit diagram of the programmable voltage-controlled oscillator 5 of an embodiment of the invention. The programmable voltage-controlled oscillator 5 of the invention has an output frequency. This preferable embodiment is a circuit construction of the programmable voltage-controlled oscillator 5, which actually is induced by the two above mentioned embodiments. As shown in FIG. 3, the programmable voltage-controlled oscillator 5 of the embodiment mainly includes a control unit 50, a one-time-programming component 51, a constant voltage source 522, a current generator 524, a series resister 526, a current mirror unit 54, a gain selector 58, a voltage follower 60 and an oscillator module 56. In the following, the programmable voltage-controlled oscillator 5 of an embodiment of the invention is detailed explained, including internal structures, functions and operations.

As shown in FIG. 3, the control unit 50 is used for providing a programmable code. The constant voltage source 522 is used for providing a first constant voltage and a second constant voltage. The current generator 524 is electrically connected to the constant voltage source 522 and the current mirror unit 54. The series resister 526 is electrically connected to the current generator 524 and the control unit 50 respectively. The series resister 526 is used for generating a selected resister value according to the programmable code provided by the control unit 50. The current generator 524 is used for generating a selected current according to a first constant voltage provided by the constant voltage source 522 and a selected resister generated by the series resister 526. The current mirror unit 54 is electronically connected to the current selector 52. The current mirror unit 54 is used for generating a first mirroring current and a second mirroring current according to the selected current generated by the current selector 52. By doing so, the oscillator module 56 of the programmable voltage-controlled oscillator 5 is able to oscillate according to the first mirroring current and the second mirroring current generated by the current mirror unit 54.

On the other hand, the gain selector 58 is electrically connected to the control unit 50. The gain selector 58 is used for generating a selected gain value according to the programmable code provided by the control unit 50 provides. The voltage follower 60 is electrically connected to the constant voltage source 522 and the gain selector 58. The voltage follower 60 is used for generating the selected reference voltage according to the second constant voltage provided by the constant voltage source 522 and the selected gain value generated by the gain selector 58. The oscillator module 56 is electrically connected to the current mirror unit 54 and the voltage follower 60 respectively. The one-time-programming component 51 is electrically connected to the control unit 50, the series resister 526 and the gain selector 58 respectively. By doing so, the oscillator module 56 of the programmable voltage-controlled oscillator 5 is able to oscillate according to the first mirroring current and the second mirroring current generated by the current mirror unit 54 generates and the selected reference voltage generated by the voltage follower 60. Besides, after adjusting the programmable code to enable the output frequency of the programmable voltage-controlled oscillator 5 to approach a predetermined frequency, the control unit 50 of the programmable voltage-controlled oscillator 5 burns the adjusted the programmable code in the one-time-programming component 51. Then, the programmable voltage-controlled oscillator 5 is able to control the output frequency according to the tuned programmable code burned in the one-time-programming component 51.

Please note that according to the programmable voltage-controlled oscillator 5 of an embodiment of the invention, the oscillator module 56 includes a first capacitor 562 and a second capacitor 564. It can be better understood by FIG. 3. Since the programmable code of the control unit 50 changes the selected resister value of the series resister 526, which further transforms the selected current generated by the generator 524, the first mirroring current and the second mirroring current generated by the current mirror unit 54 are transformed. Besides, because the first capacitor 562 and the second capacitor 564 of the oscillator module 56 enforce charging and discharging work respectively according to the first mirroring current and the second mirroring current, the first mirroring current and the second mirroring current flowing into the oscillator module 56 are then changed. Consequently, the charging speed of the capacitor of the programmable voltage-controlled oscillator 5 is changed, and the change of the output frequency of the programmable voltage-controlled oscillator 5 is further achieved.

Furthermore, according to the programmable voltage-controlled oscillator 5 of an embodiment of the invention, the oscillator module 56 includes a first operator 566 and a second operator 568. It is clearly known by FIG. 3 that the voltage follower 60 inputs the selected reference voltage into the input-ends of the first comparator 566 and the second comparator 568 respectively. The voltage follower 60 makes the selected reference voltage input the same input-ends of the first comparator 566 and the second comparator 568 respectively. Because of above the programmable code of the oscillator module 50 changes the selected gain value of the gain selector 58, which induce the can change of the voltage follower 60 generated the selected reference voltage generated by the voltage follower 60. Moreover, because the first comparator 566 and the second comparator 568 take the reference voltage according to the above mentioned the selected reference voltage as the reference voltage in the oscillator module 56. Therefore, the change that taking the comparator of the oscillator module 56 as the selected reference voltage of reference voltage enables the charging cycle of capacitor in the capacitor 5 to make a change, and further the change of the output frequency of the programmable voltage-controlled oscillator 5 is further achieved.

Please note that the voltage-controlled oscillator can be a 16-bit encode, but is not limited to. On the contrary, it is decided based upon the process precision in the programmable voltage-controlled oscillator. In manufacturing the programmable voltage-controlled oscillator provided by said invention, the output frequency can be measured by any spot in node A or node B shown in the FIG. 3. Besides, the control unit may apply an I2C encoder, operated through a serial data line (SDA) and a serial clock line (SCL). The I2C encoder may use the BCD counter to transmit different programmable codes orderly, to achieve the goal that the output frequency approaches the predetermined frequency.

To sum up, by the detailed illustration of the embodiment of the invention, it is obvious that the programmable voltage-controlled oscillator of the invention can tune the output frequency to the predetermined frequency in the manufacturing process. Moreover, with the circuit structure of said programmable voltage-controlled oscillator, the parameter of the programmable voltage-controlled oscillator is able to be adjusted by the control unit in the manufacturing process. In addition, after the control unit adjusts the output frequency to the predetermined frequency, the adjusted programmable code will be burned in the one-time-programming component, namely, the fixed output frequency. By doing so, the precision of the output frequency of the programmable voltage-controlled oscillator can be promoted effectively, and its reliability is increased as well.

Although the present invention has been illustrated and described with reference to the preferred embodiment thereof, it should be understood that it is in no way limited to the details of such embodiment but is capable of numerous modifications within the scope of the appended claims.

What is claimed is:

1. A programmable voltage-controlled oscillator having an output frequency, the programmable voltage-controlled oscillator comprising:
   a control unit for providing a programmable code;
   a current selector, electrically connected to the control unit, for generating a selected current according to the programmable code;
   a current mirror unit, electrically connected to the current selector, for generating a first mirroring current and a second mirroring current according to the selected current;
   an oscillator module, electrically connected to the current mirror unit, for oscillating according to the first mirroring current and the second mirroring current; and
   a one-time-programming component, electrically connected to the control unit and the current selector respectively, after the programmable code being tuned to make the output frequency approach a predetermined frequency, the control unit burning the tuned programmable code into the one-time-programming component;
   wherein the current selector comprises a constant voltage source for generating a first constant voltage; a current generator, electrically connected to the constant voltage source and the current mirror unit respectively; and a series resister, electrically connected to the current generator, the control unit and the one-time-programming component respectively, for generating a selected resister value according to the programmable code; wherein the current generator generates the selected current according to the first constant voltage and the selected resister value, and the programmable voltage-controlled oscillator controls the output frequency according to the tuned programmable code burned in the one-time-programming component.

2. The programmable voltage-controlled oscillator of claim 1, wherein the first mirroring current and the second mirroring current are equal to the selected current.

3. The programmable voltage-controlled oscillator of claim 1, wherein the constant voltage source is capable of providing a second constant voltage, and the programmable voltage-controlled oscillator further comprises:

a gain selector, electrically connected to the control unit and the one-time-programming component respectively, for generating a selected gain value according to the programmable code; and
   a voltage follower, electrically connected to the constant voltage source, the gain selector and the oscillator module respectively, for generating a selected reference voltage according to the second constant voltage and the selected gain value.

4. The programmable voltage-controlled oscillator of claim 3, wherein the oscillator module oscillates according to the first mirroring current, the second mirroring current and the selected reference voltage.

5. A programmable voltage-controlled oscillator having an output frequency, the programmable voltage-controlled oscillator comprising:
   a control unit for providing a programmable code;
   a constant voltage source, used for providing a second constant voltage;
   a gain selector, electrically connected to the control unit, for generating a selected gain value according to the programmable code;
   a voltage follower, electrically connected to the constant voltage source and the gain selector respectively, for generating a selected reference voltage according to the second constant voltage and the selected gain value;
   an oscillator module, electrically connected to the voltage follower, for oscillating according to the selected reference voltage; and
   a one-time-programming component, electrically connected to the control unit and the gain selector respectively, after the programmable code being tuned to make the output frequency approach a predetermined frequency, the control unit burning the tuned programmable code into the one-time-programming component;
   wherein the programmable voltage-controlled oscillator controls the output frequency according to the tuned programmable code burned in the one-time-programming component.

6. The programmable voltage-controlled oscillator of claim 5, wherein the constant voltage source further provides a first constant voltage, and the programmable voltage-controlled oscillator further comprises:
   a current generator, electrically connected to the constant voltage source, which is used for generating a constant current according to the first constant voltage; and
   a current mirror unit, electrically connected to the current generator and the oscillator module respectively, for generating a first mirroring current and a second mirroring current according to the constant current;
   wherein the oscillator module oscillates according to the first mirroring current, the second mirroring current and the selected reference voltage.

* * * * *